(12) United States Patent
Chamoun et al.

(10) Patent No.: US 11,774,774 B2
(45) Date of Patent: Oct. 3, 2023

(54) STRUCTURE FOR COLLIMATING A LIGHT SOURCE

(71) Applicant: Palo Alto Research Center Incorporated, Palo Alto, CA (US)

(72) Inventors: Jacob Chamoun, Stanford, CA (US); Patrick Y. Maeda, Mountain View, CA (US); Joerg Martini, San Francisco, CA (US); Christopher L. Chua, San Jose, CA (US)

(73) Assignee: Xerox Corporation, Norwalk, CT (US)

( * ) Notice: Subject to any disclaimer, the term of this patent is extended or adjusted under 35 U.S.C. 154(b) by 148 days.

(21) Appl. No.: 17/408,622

(22) Filed: Aug. 23, 2021

(65) Prior Publication Data
US 2023/0057298 A1    Feb. 23, 2023

(51) Int. Cl.
*G02B 27/30*    (2006.01)
*H01L 33/54*    (2010.01)
*H01S 5/42*    (2006.01)

(52) U.S. Cl.
CPC ............. *G02B 27/30* (2013.01); *H01S 5/423* (2013.01)

(58) Field of Classification Search
CPC ......... G02B 27/30; H01L 33/54; H01L 33/56; H01S 5/423; H01S 5/18388; H01S 5/0267
See application file for complete search history.

(56) References Cited

U.S. PATENT DOCUMENTS

| | | | |
|---|---|---|---|
| 7,327,774 B2 | 2/2008 | Chabinyc et al. | |
| 7,688,876 B2 | 3/2010 | Chabinyc et al. | |
| 9,630,424 B2 | 4/2017 | Stowe et al. | |
| 10,965,103 B2 | 3/2021 | Gronenborn et al. | |
| 2005/0019973 A1 | 1/2005 | Chua | |
| 2008/0096298 A1* | 4/2008 | Chabinyc | B82Y 30/00 257/E33.067 |
| 2015/0273863 A1* | 10/2015 | Stowe | B41J 2/455 347/233 |

OTHER PUBLICATIONS

V. Bardinal, B. Reig, T. Camps, E. Daran, J. B. Doucet, C. Turek, J. P. Malval, D. J. Lougnot, and O. Soppera; "A microtip self-written on a vertical-cavity surface-emitting laser by photopolymerization"; Appl. Phys. Lett. 96, 051114 (2010).

(Continued)

*Primary Examiner* — Ryan D Howard
(74) *Attorney, Agent, or Firm* — Ortiz & Lopez, PLLC; Luis M. Ortiz; Kermit D. Lopez

(57) ABSTRACT

A structure can be provided for collimating light from a light source (e.g., vertical cavity surface emitting diodes). The structure can include at least one light source, a pit formed at an output of the at least one light source and a microbead formed in the pit. Microbeads can function as a lens to collimate light emitting from the at least one light source. The structure can provide by forming an array of VCSELs on a substrate, forming a pit in front of each VCSEL of the array of VCSELs, and assembling a microbead in each pit formed in front of each VCSEL. The microbeads can thereby function as lenses to collimate light emitted from the VCSELs.

20 Claims, 10 Drawing Sheets

(56) References Cited

OTHER PUBLICATIONS

V. Bardinal, B. Reig, T. Camps, C. Levallois, E. Daran, C. Vergnenègre, T. Leïchlé, G. Almuneau, and J. B. Doucet; "Spotted Custom Lenses to Tailor the Divergence of Vertical-Cavity Surface-Emitting Lasers"; IEEE Photonics Technology Letters, vol. 22, No. 21, Nov. 1, 2010.
V. Bardinal, T. Camps, B. Reig, D. Barat, E. Daran, and J. B. Doucet; "Collective Micro-Optics Technologies for VCSEL Photonic Integration", Hindawi Publishing Corporation, Advances in Optical Technologies, vol. 2011, Article ID 609643, 11 pages, doi:10.1155/2011/609643.
O. Blum, et al., "Vertical-cavity surface-emitting lasers with integrated refractive microlenses", Electronics Letters, Jan. 5, 1995, vol. 31, No. 1.
Yongqi Fu, "Integration of Microdiffractive Lens with Continuous Relief with Vertical-Cavity Surface-Emitting Lasers Using Focused Ion Beam Direct Milling", IEEE Photonics Technology Letters, vol. 13, No. 5, May 2001.
Si-Hyun Park, Yeonsang Park, Hyejin Kim, Heonsu Jeon, Seong Mo Hwang, Jeong Kwan Lee, Seung Ho Nam, Byeong Cheon Koh, J. Y. Sohn, and D. S. Kim; "Microlensed vertical-cavity surface-emitting laser for stable single fundamental mode operation", Appl. Phys. Lett. 80, 183 (2002).
Zhenfu Wang, et al., "High power and good beam quality of two-dimensional VCSEL array with integrated GaAs microlens array", Nov. 8, 2010 / vol. 18, No. 23 / Optics Express 23900.

\* cited by examiner

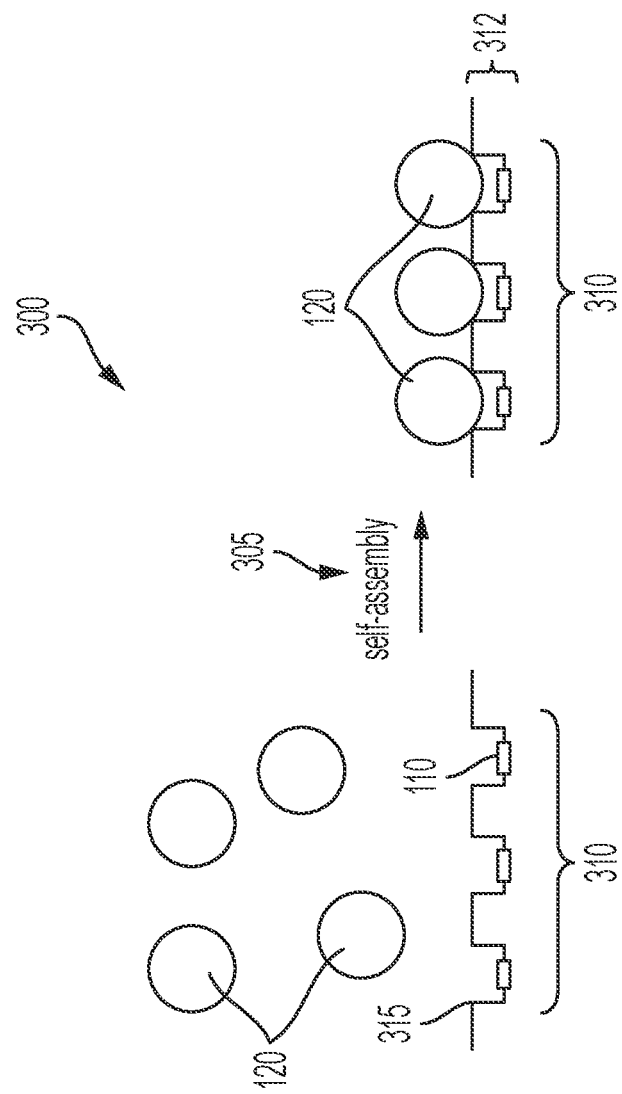

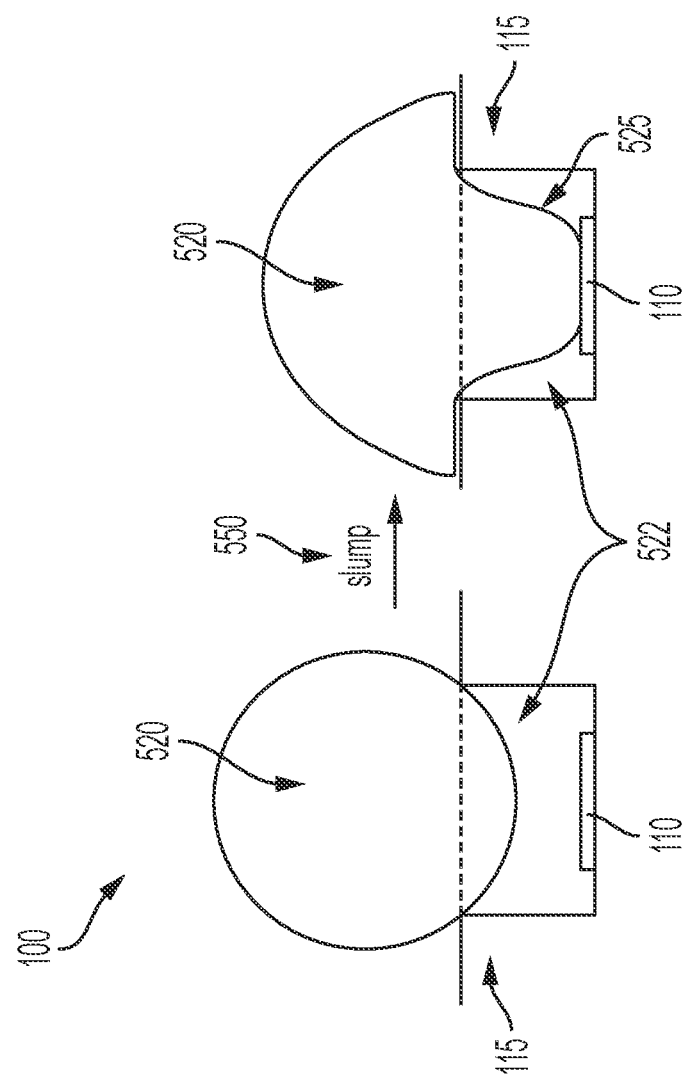

STRUCTURE FOR COLLIMATING A LIGHT SOURCE

TECHNICAL FIELD

Embodiments are related to optically controlled lighting systems. Embodiments are also related to semiconductor lasers. More particularly, embodiments relate to systems and methods for optically collimating a semiconductor light source such as a vertical cavity surface emitting laser (VCSEL) by decreasing the divergence angle of light emanating from the VCSEL.

BACKGROUND

VCSELs are tiny semiconductor-based lasers that emit perpendicular to a substrate. One of the primary advantages of VCSELs is that they can be patterned into dense arrays with many hundreds or thousands of individual emitters. A collimated light source is one where the rays emerge parallel. The dense packing of emitters in a VCSEL array makes collimation difficult. Technical uses of VCSEL arrays include telecommunication systems, light detection and ranging (lidar) systems, printing systems, laser processing systems, and 3d mapping systems and devices (e.g. smartphone face identification)

Methods of VCSEL collimation can be divided into 3 categories: hybrid assembly, monolithic, and surface engineered using polymer. Hybrid assembly usually means using a separate microlens array with the same pitch as the VCSEL array. This presents a difficult alignment step and cannot be easily scaled. Monolithic techniques remove material from the VCSEL die to form a lens. This is a problem for top-emitting devices because the substrate material that forms the lens is GaAs which absorbs below 870 nm. Techniques where layers of transparent InGaP or GaN are added and then subsequently etched have been demonstrated but are still technically challenging for mass production. Surface engineering with polymers includes lithographically patterning polyimide posts and then melting them, patterning SU-8 posts and then spotting a liquid polymer on them and self-writing by NIR photopolymerization. These approaches are at a low level of technical maturity and may require steps that are incompatible with other parts of VCSEL fabrication, such as heating to a high temperature to melt a polymer.

What is needed are improved systems and methods for collimating light emitted from semiconductor arrays that are densely packed.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the embodiments to provide improved semiconductor array light collimating structures.

It is another aspect of the embodiments to provide a structure for collimating light from at least one light source that can include a pit formed at an output of the at least one light source and a microbead formed in the pit, wherein the microbead functions as a lens to collimate light emitting from the at least one light source.

It is another aspect of the embodiments to provide a structure for collimating light from at least one light source that can include a pit formed at an output of the at least one light source and a microbead formed in the pit, wherein the microbead functions as a lens to collimate light emitting from the at least one light source, wherein the at least one light source is at least one of: a vertical cavity surface emitting laser (VCSEL), an LED, an edge-emitting laser, a fiberoptic tip.

It is yet another aspect of the embodiments to provide a structure for collimating light from an array of semiconductor lasers that include pits formed at outputs of each semiconductor laser of the array of semiconductor lasers and a microbead formed in each pits, wherein the microbead functions as a lens to collimate light emitting from the each semiconductor laser of the array of semiconductor lasers.

It is another aspect of the embodiments to provide a structure for collimating light from an array of vertical cavity semiconductor lasers (VCSELs) wherein each VCSEL includes an output, a pit formed at an output of the at least one light source and a microbead formed in the pit, the microbead adapted to functions as a lens to collimate light emitting from the at least one light source.

It is another aspect of the embodiments to provide a structure for collimating light from an array of vertical cavity semiconductor lasers (VCSELs) densely formed on a substrate, wherein each VCSEL includes an output, a pit formed at an output of the at least one light source and a microbead formed in the pit, the microbead adapted to functions as a lens to collimate light emitting from the at least one light source.

It is yet another aspect of the embodiments to provide a structure for collimating light from an array of semiconductor lasers that include pits formed at outputs of each semiconductor laser of the array of semiconductor lasers and a microbead formed in each pits by self assembly, wherein the microbead functions as a lens to collimate light emitting from the each semiconductor laser of the array of semiconductor lasers.

It is yet another aspect of the embodiments to provide a structure for collimating light from an array of semiconductor lasers that include pits formed at outputs of each semiconductor laser of the array of semiconductor lasers and a microbead formed by slumping into each of the pits, wherein the microbead functions as a lens to collimate light emitting from the each semiconductor laser of the array of semiconductor lasers.

It is another aspect of the embodiments to provide a method for providing a structure for collimating light emitting from an array of semiconductor lasers that includes forming an array of semiconductor lasers on a substrate, forming a pit in front of each semiconductor laser of the array of semiconductor lasers, and assembling a microbead in each pit formed in front of each semiconductor laser, wherein the microbeads thereby function as lenses to collimate light emitted from the semiconductor lasers.

It is another aspect of the embodiments to provide a method for providing a structure for collimating light emitting from an array of semiconductor lasers that includes forming an array of semiconductor lasers on a substrate, forming a pit in a die associated with the array of semiconductor lasers and in front of each semiconductor laser, and assembling a microbead in each pit formed in front of each semiconductor laser, wherein the microbeads thereby function as lenses to collimate light emitted from the semiconductor lasers.

It is another aspect of the embodiments to provide a method for providing a structure for collimating light emitting from an array of semiconductor lasers that includes forming an array of semiconductor lasers on a die, depositing a material on top of the die that includes the array of semiconductor lasers, forming a pit in the material that is deposited on top of the die associated with the array of semiconductor lasers and in front of each semiconductor laser, and assembling a microbead in each pit formed in front of each semiconductor laser, wherein the microbeads thereby function as lenses to collimate light emitted from the semiconductor lasers.

It is another aspect of the embodiments to provide a method for providing a structure for collimating light emitting from an array of semiconductor lasers that includes forming an array of semiconductor lasers on a die, depositing a material on top of the die that includes the array of semiconductor lasers, forming a pit in the material that is deposited on top of the die associated with the array of semiconductor lasers and in front of each semiconductor laser, and assembling a microbead in each pit formed in the die in front of each semiconductor laser by settlement out of a suspension, wherein the microbeads thereby function as lenses to collimate light emitted from the semiconductor lasers.

It is another aspect of the embodiments to provide a method for providing a structure for collimating light emitting from an array of semiconductor lasers that includes forming an array of semiconductor lasers on a die, depositing a material on top of the die that includes the array of semiconductor lasers, forming a pit in the material that is deposited on top of the die associated with the array of semiconductor lasers and in front of each semiconductor laser, and assembling a microbead in each pit formed in the die in front of each semiconductor laser by settlement out of a suspension wherein the microbead is assembled in each pit by becoming trapped in each pit by settlement out of a suspension, the microbeads functioning as lenses to collimate light emitted from the semiconductor lasers.

It is another aspect of the embodiments to provide a method for providing a structure for collimating light emitting from an array of semiconductor lasers that includes forming an array of semiconductor lasers on a die, depositing a material on top of the die that includes the array of semiconductor lasers, forming a pit in the material that is deposited on top of the die associated with the array of semiconductor lasers and in front of each semiconductor laser, and assembling a microbead in each pit formed in the die in front of each semiconductor laser by settlement out of a suspension, wherein the microbeads thereby function as lenses to collimate light emitted from the semiconductor lasers.

It is another aspect of the embodiments to provide a method for providing a structure for collimating light emitting from an array of semiconductor lasers that includes forming an array of semiconductor lasers on a die, depositing a material on top of the die that includes the array of semiconductor lasers, forming a pit in the material that is deposited on top of the die associated with the array of semiconductor lasers and in front of each semiconductor laser, and assembling a microbead in each pit formed in the die in front of each semiconductor laser by settlement out of a suspension wherein each microbead becomes slumped in the each pits, wherein the microbeads thereby function as lenses to collimate light emitted from the semiconductor lasers.

It is another aspect of the embodiments to provide a method for providing a structure for collimating light emitting from an array of semiconductor lasers that includes forming an array of semiconductor lasers on a die, depositing a material on top of the die that includes the array of semiconductor lasers, forming a pit in the material that is deposited on top of the die associated with the array of semiconductor lasers and in front of each semiconductor laser, and assembling a microbead in each pit formed in the die in front of each semiconductor laser by settlement out of a suspension wherein each microbead becomes slumped in the each pits via at least one of a thermal or chemical influence to thereby aspherize the microbead to at least one of reduced spherical aberration, improve surface quality, or close an air gap between the microbead and each semiconductor laser, wherein the microbeads thereby function as lenses to collimate light emitted from the semiconductor lasers.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

FIG. 3A to FIG. 3B illustrate a block diagram of an array of VCSELs that can include pits associated with each VCSEL and microbeads that can be self assembled over each VCSEL of the array of VCSELs within each of the pits, in accordance with an embodiment;

FIG. 5 illustrates a block diagram depicting slumping of microbeads, in accordance with an optional feature of the embodiments;

DETAILED DESCRIPTION

Figure 1:
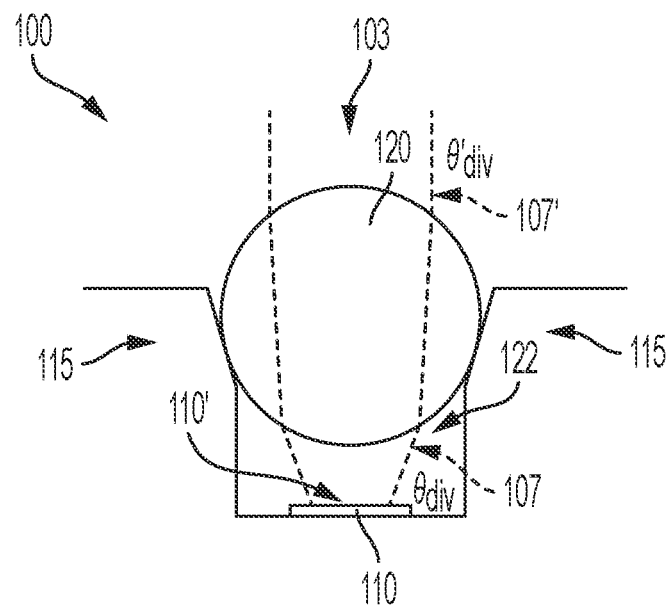
FIG. 1 illustrates a block diagram of a structure for collimating light produced by a light source, in accordance with an embodiment.

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein do not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part. In addition, identical reference numerals utilized herein with respect to the drawings can refer to identical or similar parts or components.

In general, terminology may be understood, at least in part, from usage in context. For example, terms such as "and," "or," or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The term "data" as utilized herein can relate to physical signals that can indicate or include information. The term "image" as utilized herein can relate to a pattern of physical light or a collection of data representing the physical light, and may include characters, words, and text as well as other features such as graphics.

The term vertical cavity light emitting laser (VCSEL) as utilized herein relates to a type of "semiconductor laser" technology. Reference to the term vertical cavity surface emitting laser and VCSEL is not intended to limit the embodiments to a particular light source and is only provided as a preferred embodiment. It should be appreciated that other semiconductor lights sources can benefit from the teaching herein. VCSEL semiconductor materials can include GaAs, AlGaAs, InP, GaN.

The term "self assembly" (also referred to as "self-assembly") is related to is the process in which a system's components—be it molecules, polymers, colloids, or macroscopic particles—organize into ordered and/or functional structures or patterns as a consequence of specific, local interactions among the components themselves, without external direction. In self-assembly, a bottom-up approach can be utilized where controlled interactions between molecules of controlled geometry is generally used to get structures where one dimension is at the nanoscale. In another strategy, top-down methods can be utilized where macroscopic materials are divided into smaller objects or structures.

Referring to FIG. 1 illustrated is a block diagram of a structure 100 for collimating light 103 produced by a light source 110, in accordance with a system embodiment. The embodiments disclosed herein are different from the state of the art in that they use a microbead trapped 120 in a pit 115 as a lens to collimate the light source 110 (e.g., VCSEL) output 107. Unlike other hybrid assembly methods, present embodiments do not require an alignment step because the microbeads 120 can be self-assembled in front of the light sources 110. For this reason, this approach is highly scalable to a large number of emitters and could be implemented at the wafer level.

Figure 2:
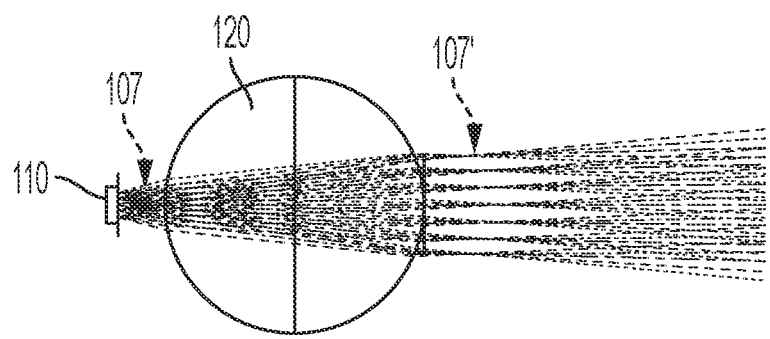
FIG. 2 illustrates an alternate diagram illustrating light emitting from a light source being collimated by a microbead and resulting in an output of collimated light, in accordance with an embodiment.

The structure 100 that is illustrated in FIG. 1 can include a light source 110, a pit 115 formed around the output of the light source 110, and a microbead 120 formed in the pit 115 in front of the output 110' of the light source 110. The size of the light source 110 can be a fraction of the diameter of the microbead 120. In accordance with operation of the structure 100, light rays 107 emerging from the output 110' of the light source 110 in a diverging cone of rays can be characterized by a divergence angle $\theta_{div}$. When the rays hit the microbead 120, they refract at the air/bead interface 122 causing them to change direction according to Snell's law. When the light rays 107' emerge from the bead 120, the new divergence $\theta_{div}'$ of the cone satisfies $\theta_{div}'<\theta_{div}$, i.e., the divergence is decreased. For $\theta_{div}'=0$ the output beam can be collimated. Referring to FIG. 2, illustrated is an alternate diagram illustrating light 107 emitting from a light source 110 being collimated by a microbead 120 and resulting in an output of collimated light 107'. Microbead materials can include silica, polystyrene, polyethylene.

The light source 110 can be at least one of: a vertical cavity surface emitting laser (VCSEL), an LED, and edge-emitting laser, and a fiberoptic tip. For purposes of disclosure, but without limitation, a vertical cavity surface emitting laser (VCSEL) will be referred to as the light source 110 herein. Referring now to FIG. 3, a block diagram 300 of an array of VCSELs 310 is illustrated that include pits 315 associated with each VCSEL and microbeads 120 that can be self assembled over each VCSEL 110 of the array of VCSELs 310 within each of the pits 315. It is beneficial in developing a collimated light structure where an array of semiconductor light sources 310 are densely packed on a substrate is concerned that care is taken in the design of the pit structure, and that the structure can be self-assembled 305.

Figure 4A:
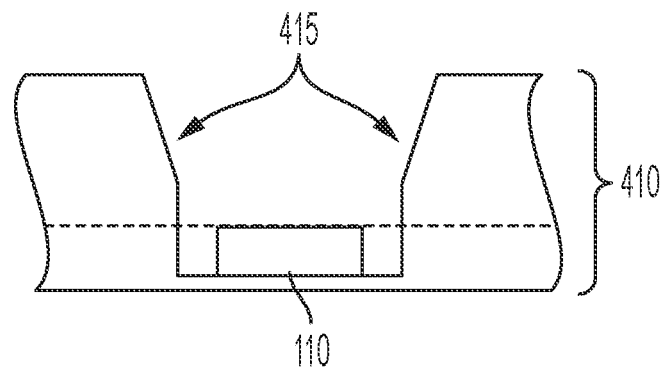
FIGS. 4A-4B illustrate a block diagram of two pit structures, in accordance with aspects of the embodiments.
Figure 4B:
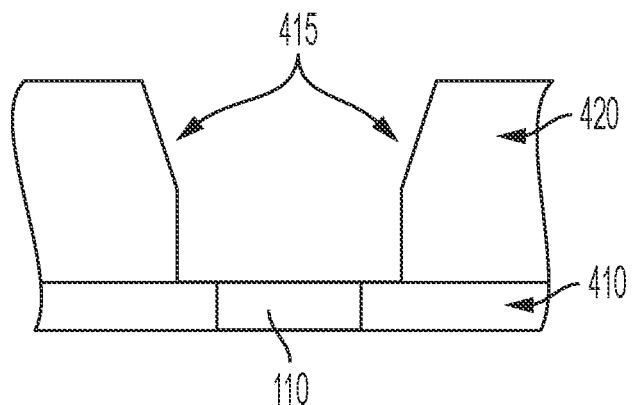

Referring to FIGS. 4A-4B, illustrated is a block diagram of two pit structures, in accordance with the embodiments. As shown in FIG. 4A, the pit structure 415 can be part of the VCSEL die 410, or as shown in FIG. 4B, the pit structure 415 can be a different material 420 that is deposited on top of the VCSEL die 410. The pit structure 415 design can be important because at the short length scales associated with a microbead (10-1000 um) the optical alignment can be sensitive to displacements of the microbead 120 at around the 0.5 um level. The centration of a microbead 120 on the VCSEL 110 can be ensured by the patterning of the pit structure 415 and by the high degree of sphericity of the microbead 120. However, the longitudinal alignment can become a potential issue because an ensemble of microbeads 120 can have a variability in radius from microbead to microbead, e.g. r=15+/−1 um. Thus, a pit 115 designed for the nominal radius r does not generally satisfy the optical alignment condition for a microbead 120 with radius r+Δr. Importantly, by proper choice of the pit structure 415 it can be possible to maintain alignment even if the bead size deviates from the nominal value, as shown below.

In general, there is an optimal separation $s_{opt}(r)=k*r$ between the light source 110 and the center of the microbead 120 where the output rays attain the lowest divergence. For example, for a small aperture where optical aberrations can be neglected, the source should be separated from the center of the microbead by the effective focal length EFL of a ball lens given by:

$$EFL = \frac{nr}{2(n-1)} \quad (1.1)$$

For a silica ball lens, EFL≈1.5*r. The actual separation $s_{act}(r)$ depends on the pit geometry. For the square pit in FIG. 3 it can be shown that the following choices of d and h make the difference $\varepsilon=|s_{act}(r)-s_{opt}(r)|$ satisfy $\varepsilon \propto (\Delta r/r)^2$, i.e. the first order error in Δr can be eliminated, as follows:

$$d = r\sqrt{1 - \frac{1}{k^2}} \quad (1.2)$$

$$h = r\left(k - \frac{1}{k}\right) \quad (1.3)$$

For example, for a square pit designed for a silica bead with r=15 um, equations 1.2 and 1.3 give d=11.18 um and h=12.5 um. For a bead of size r=15+/−1 um, the resulting longitudinal alignment error is −50/−70 nm, which is acceptable. For the angled pit in FIGS. 4a and 4B. the alignment error can be eliminated to all orders in Δr by choosing the pit angle θ to satisfy:

$$\theta = \sin^{-1}(1/k) \quad (1.4)$$

It can be appreciated that, by proper design of the pit, it is possible to eliminate the optical alignment error associated with variability in the microbead size.

The self-assembly can be based on a colloidal process where the microbeads 120 settle out of a suspension. Trapping of microbeads 120 in pits 120 can be based on gravity directed settling of microbeads 120 into a pit or by chemical tags that bind specifically to the pit 120. Transverse motion of microbeads 120 across the die 330 can be accomplished by tilting the die, spinning, sonicating, flowing a suspension of beads across the die, or other means.

Referring to FIG. 5, illustrated is a block diagram depicting slumping of microbeads 120, in accordance with the embodiments. After a microbead 520 is trapped in a pit 520, post-processing steps can include a process of slumping 550 the microbead 520 through thermal or chemical methods to aspherize 525 the microbead 520 to reduce the effects of spherical aberration and/or improve the surface quality and/or to close the air gap 522 between the microbead 520 and the light source 510. Other post-processing steps can include the application of anti-reflection (AR) coatings.

Another way to reduce spherical aberration and thereby improve collimation could be to use inhomogeneous beads where the index of refraction varies as a function n(r) as in a Luneburg lens. Such a bead could be fabricated by altering the process parameters during bead formation or by taking already made beads and doping them through diffusion from the outside.

The flowchart and block diagrams in the figures illustrate the architecture, functionality, and operation of possible implementations of systems and methods according to various embodiments of the present invention. FIG. 6 to FIG. 11 are shown only as exemplary diagrams of methods steps in which example embodiments may be implemented. It should be appreciated that FIG. 6 to FIG. 11 are only exemplary and are not intended to assert or imply any limitation with regard to the environments in which aspects or embodiments may be implemented. Many modifications to the depicted environments may be made without departing from the spirit and scope of the disclosed embodiments.

Figure 6:
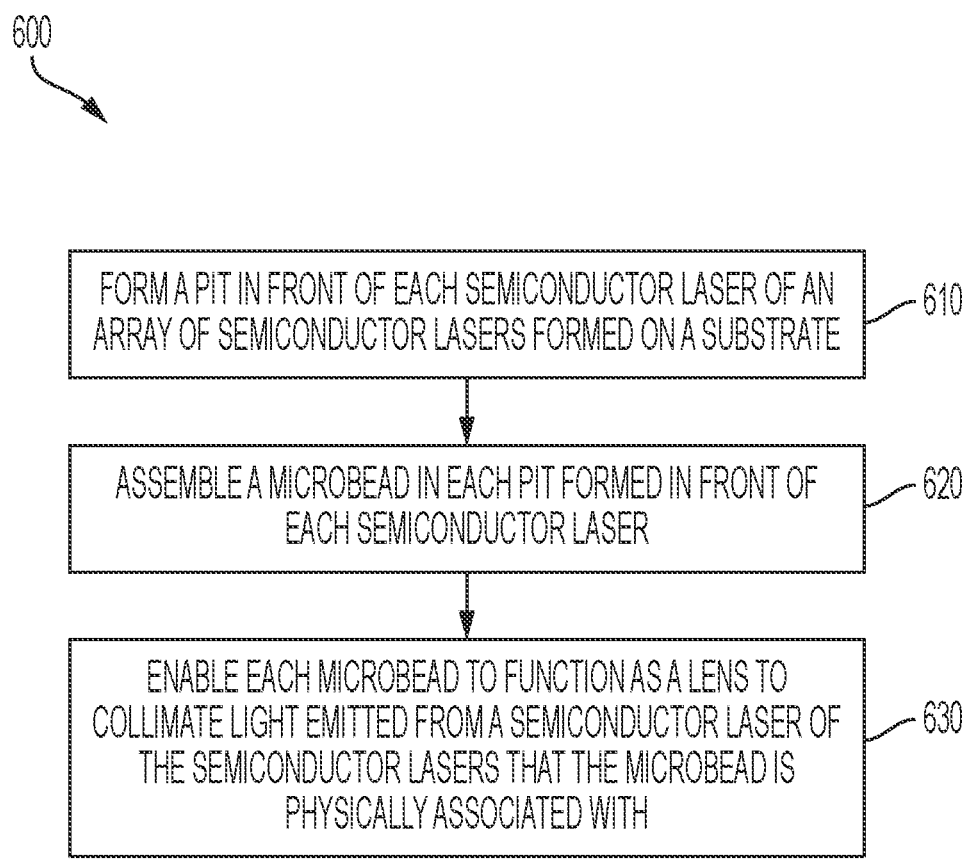
FIG. 6 illustrates a flow diagram of a method for providing a light collimating structure, in accordance with an embodiment.

Referring to FIG. 6, a flow diagram is illustrated of a method 600 for providing a light collimating structure is illustrated in accordance with the embodiments. As shown in Block 610, light emanating from an array of semiconductor lasers can be collimated by forming a pit in front of each semiconductor laser of the array of semiconductor lasers formed on a substrate. Then, as illustrated in Block 620, a microbead can be assembled in each pit formed in front of each semiconductor laser. The microbead can then function as a lens or lenses to collimate light emitted from the semiconductor laser that it is associated with from the array of semiconductor lasers, as depicted at Block 630.

Figure 7:
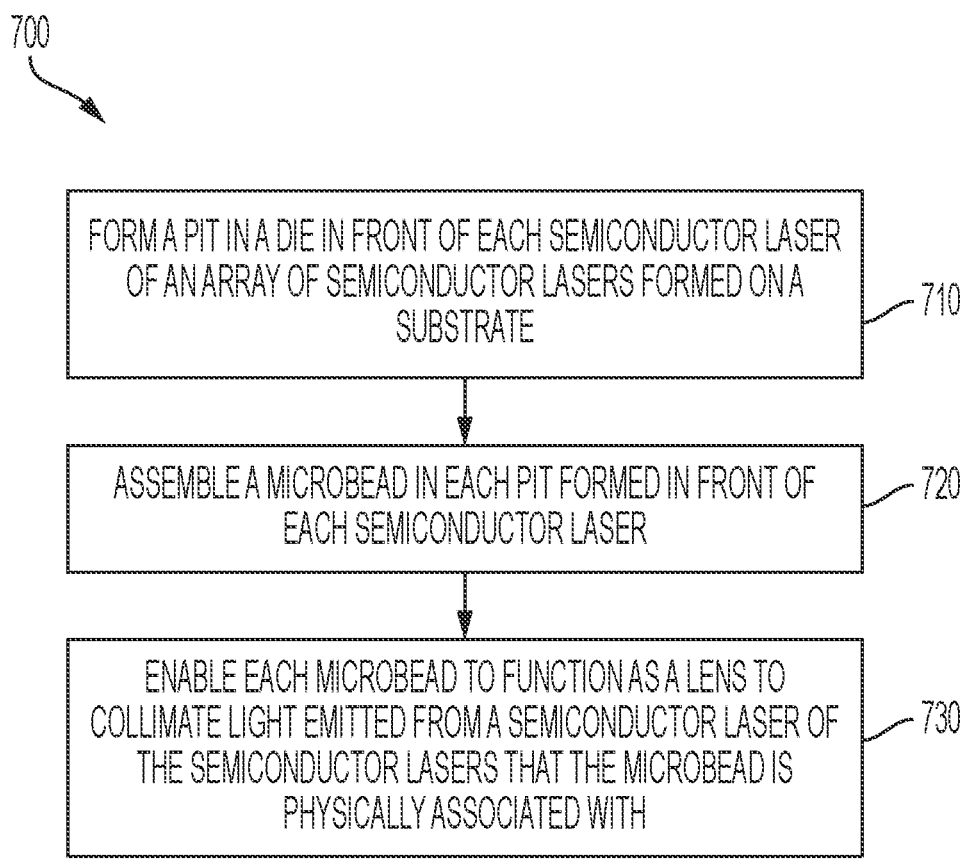
FIG. 7 illustrates a flow diagram of a method for providing a light collimating structure, in accordance with an embodiment.

Referring to FIG. 7, illustrated is a flow diagram of a method 700 for providing a light collimating structure in accordance with the embodiments. As indicated at Block 710, a pit can be formed in a die in front of each semiconductor laser of an array of semiconductor laser formed on a substrate. As shown in Block 720, a microbead can be assembled in each pit formed in front of each semiconductor laser. Then, as described at Block 730, each microbead can be enabled to function as a lens to collimate light emitted from the semiconductor laser of the array semiconductors lasers that each microbead is associated with.

Figure 8:
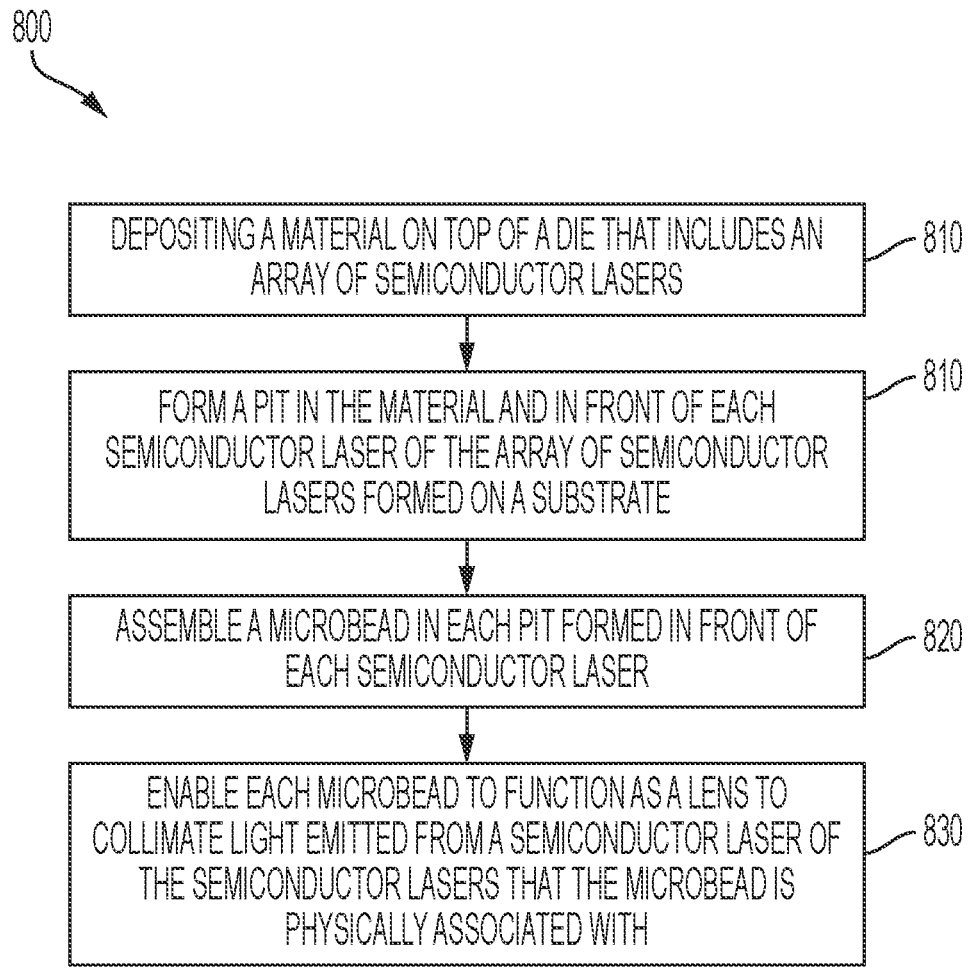
FIG. 8 illustrates a flow diagram of a method for providing a light collimating structure, in accordance with the embodiment.

Referring to FIG. 8, illustrated is a flow diagram of a method 800 for providing a light collimating structure in accordance with the embodiments. As shown at Block 810, a material can be deposited on top of a die that includes an array of semiconductor lasers. As depicted at Block 820, a pit can be formed in the material and in front of each semiconductor laser of the array of semiconductor laser formed on a substrate. As shown in Block 830, a microbead can be assembled in each pit formed in front of each semiconductor laser. Then, as indicated at Block 840, each microbead can be enabled to function as a lens to collimate light emitted for the semiconductor it is associated with from the array semiconductor lasers.

Figure 9:
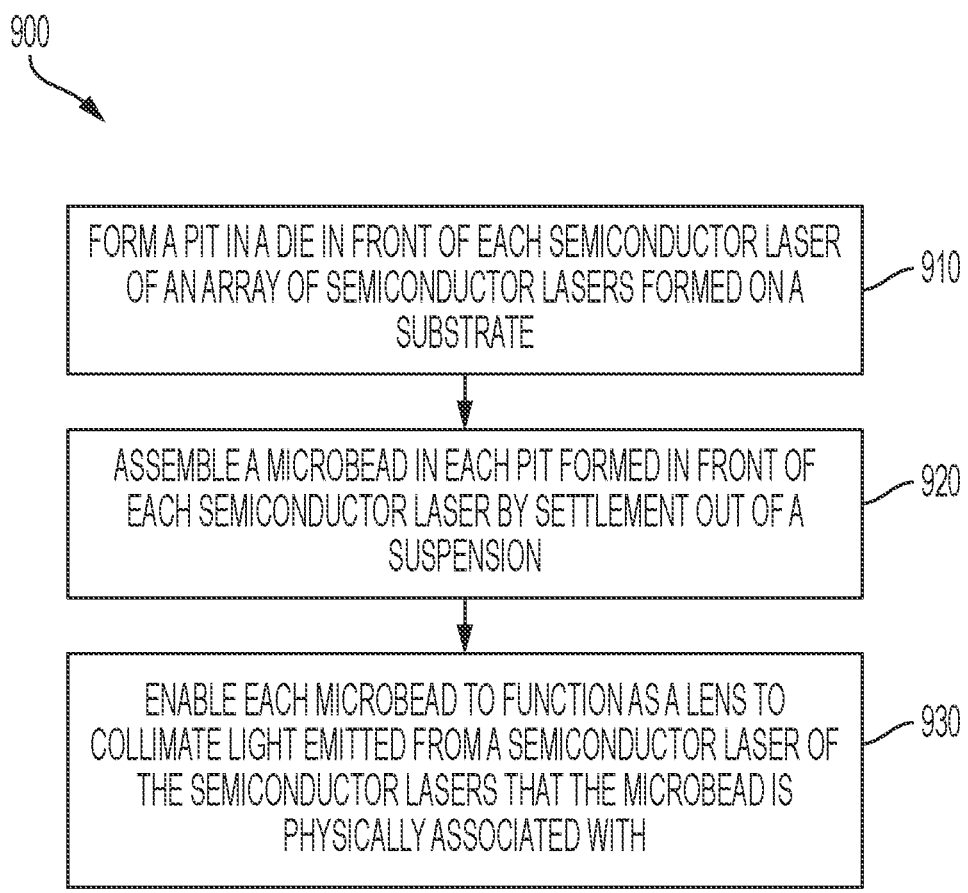
FIG. 9 illustrates a flow diagram of a method for providing a light collimating structure, in accordance with an embodiment.

Referring to FIG. 9, illustrated is a flow diagram of a method 900 for providing a light collimating structure in accordance with the embodiments. As depicted at Block 910, a pit can be formed in a die in front of each semiconductor laser of an array of semiconductor lasers formed on a substrate. As indicated at Block 920, a microbead can be assembled in each pit formed in front of each semiconductor laser by settlement of the microbeads out of a suspension. Then, each microbead can function as lenses to collimate light emitted from the semiconductor laser that it is associated with from the array of semiconductor lasers, as shown at Block 930.

Figure 10:
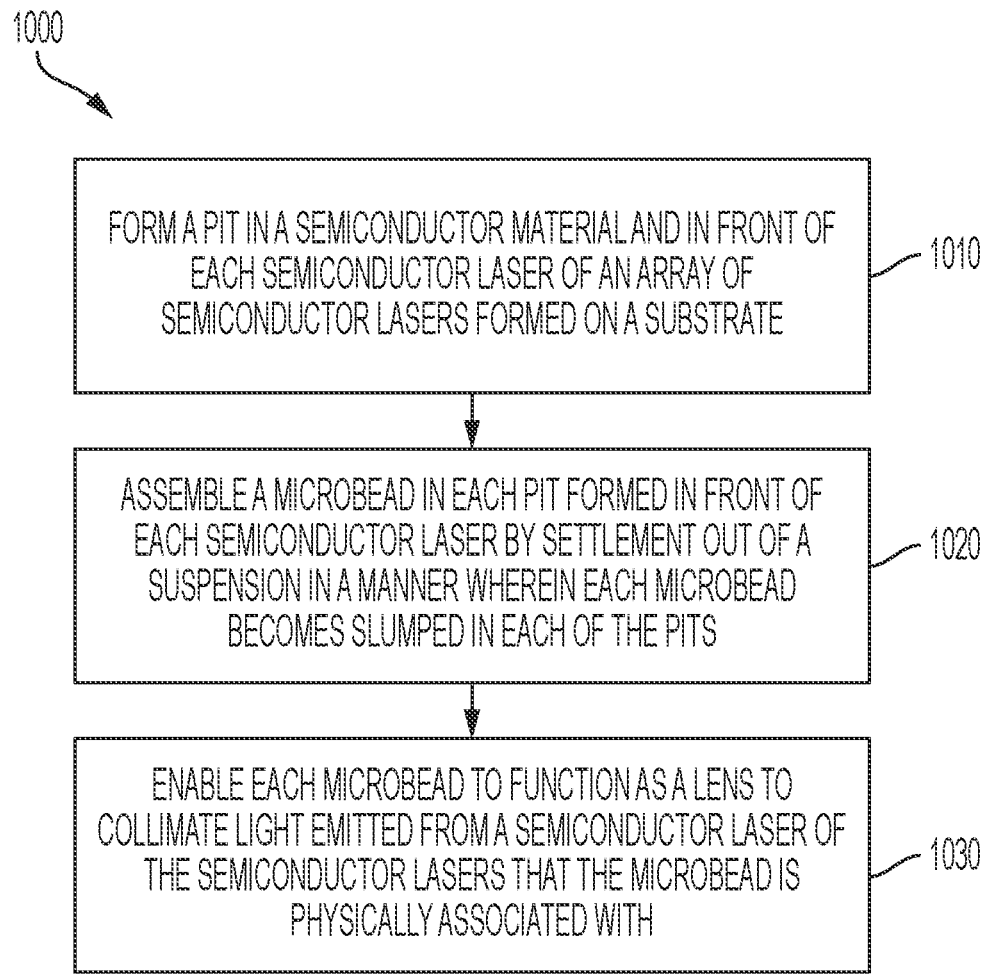
FIG. 10 illustrates a flow diagram of a method for providing a light collimating structure, in accordance with an embodiment.

Referring to FIG. 10, illustrated is a flow diagram of a method 1000 for providing a light collimating structure in accordance with the embodiments. A pit can be formed in a semiconductor material and in front of each semiconductor laser of an array of semiconductor lasers formed on a substrate, as indicated at Block 1010. As shown at Block 1020, a microbead can be formed in each pit formed in front of each semiconductor laser by settlement out of a suspension in a manner wherein each microbead becomes slumped in each of the pits. Then, as illustrated at Block 1030, each microbead can function as a lens (or lenses) to collimate light emitted from the semiconductor laser that it is associated with from the array of semiconductor lasers.

Figure 11:
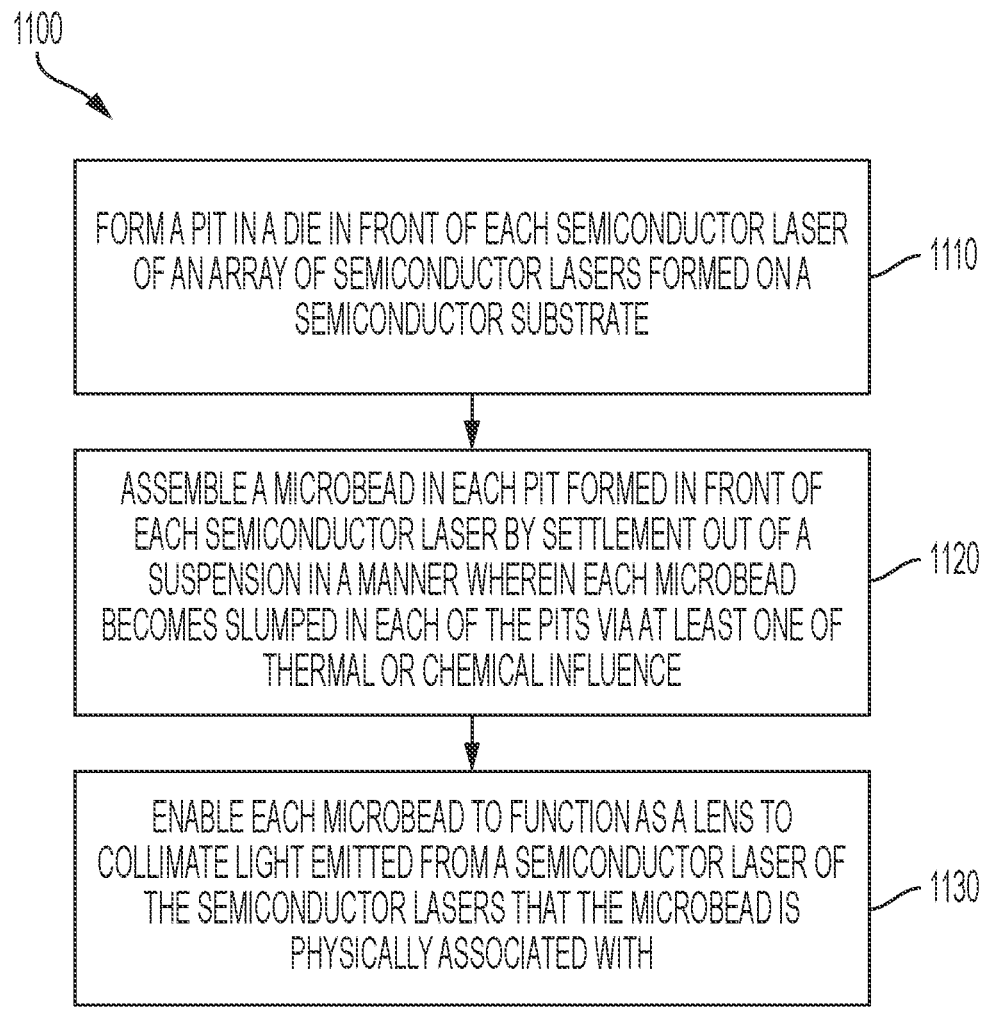
FIG. 11 illustrates a flow diagram of a method for providing a light collimating structure, in accordance with an embodiment.

Referring to FIG. 11, a flow diagram is illustrated of a method 1100 for providing a light collimating structure in accordance with the embodiments. As shown at Block 1110, a pit can be formed in front of each semiconductor laser of an array of semiconductor lasers formed on a semiconductor substrate. As depicted at Block 1120, a microbead can be assembled in each pit formed in front of each semiconductor laser by settlement out of a suspension in a manner wherein each microbead becomes slumped in each of the pits via at least one of thermal or chemical influence. Then, as described at Block 1130, each microbead can then function as lenses to collimate light emitted from the semiconductor laser that it is associated with the array of semiconductor lasers.

It will be appreciated that variations of the above-disclosed and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A structure for collimating light, comprising:
at least one light source;
a pit formed at an output of the at least one light source; and
a microbead formed in the pit, wherein the microbead is assembled in the pit by becoming trapped in the pit by settlement out of a suspension;
wherein the microbead functions as a lens to collimate light emitting from the at least one light source.

2. The structure for collimating light of claim 1, wherein the at least one light source is at least one of: a vertical cavity surface emitting laser (VCSEL), and LED, and edge-emitting laser, a fiberoptic tip.

3. The structure for collimating light of claim 1, wherein the at least one light source is an array of vertical cavity surface emitting lasers (VCSELs) densely formed on a substrate.

4. The structure for collimating light of claim 1, wherein the microbead is formed in the pit by self-assembly.

5. The structure for collimating light of claim 1, wherein the microbead formed in the pit includes slumping of the microbead in the pit.

6. The structure for collimating light of claim 1, wherein the at least one light source comprises an array of vertical cavity surface emitting lasers (VCSELs) densely packed on a substrate, wherein microbeads are formed in pits formed at outputs of the VCSELS forming the array by self-assembly.

7. The structure for collimating light of claim 6, wherein the microbeads are formed in the pits in a manner that include slumping of the microbeads in the pits.

8. The structure of claim 1, wherein:
the at least one light source further comprises an array of vertical cavity surface emitting lasers (VCSELs) densely packed on a substrate;
the pit formed at an output of the at least one light source further comprises pits formed at an output of each of the VCSELs; and
a microbead formed in each of the pits;
wherein the microbeads function as lenses for each of the VCSELs to collimate light emitting from them.

9. A structure for collimating light emitting from an array of vertical cavity surface emitting lasers (VCSELs), comprising:
a pit formed at an output of each VCSEL of the array of VCSELs; and
a microbead formed in each pit, wherein the microbead is assembled in the each pit by becoming trapped in the each pit by settlement out of a suspension;
wherein the microbead functions as a lens to collimate light emitting from each VCSEL.

10. The structure for collimating light of claim 9, wherein the microbead is formed in each pit by self-assembly.

11. The structure for collimating light of claim 9, wherein the microbead formed in each pit includes slumping of the microbead in the pit.

12. The structure for collimating light of claim 9, wherein the array of VCSELs are densely packed on the substrate.

13. The structure for collimating light of claim 9, wherein the microbead is assembled in each pit formed in front of the each VCSEL of the array of VCSELs.

14. The structure of claim 13, wherein the microbead assembled in the each pit is slumped into the each pit via at least one of: a thermal or chemical influence to thereby aspherize the microbead to at least one of reduce spherical aberration, improve surface quality, or close an air gap between the microbead and each VCSEL.

15. A method for collimating light emitting from an array of vertical cavity surface emitting lasers (VCSELs), comprising:
forming an array of VCSELs on a substrate;
forming a pit in front of each VCSEL of the array of VCSELs;
assembling a microbead in each pit formed in front of each VCSEL;
slumping the microbead assembled in the each pit via at least one of a thermal or chemical influence to aspherize the microbead, wherein microbeads thereby function as lenses to collimate light emitted from the VCSELs among the array of VCSELs.

16. The method of claim 15, wherein the pit is part of a die associated with the each VCSEL.

17. The method of claim 15, wherein the pit comprises a material that is deposited on top of a die associated with the each VCSEL.

18. The method of claim 15, wherein the microbead is assembled in the each pit by settlement out of a suspension.

19. The method of claim 15, wherein the microbead is assembled in the each pit by becoming trapped in each pit by settlement out of a suspension.

20. The method of claim 15, wherein the microbead assembled in the each pit is slumped via at least one of the thermal or chemical influence to thereby aspherize the microbead to at least one of: reduce spherical aberration, improve surface quality, or close an air gap between the microbead and the each VCSEL.

* * * * *